May 25, 1965 R. R. POTTER ETAL 3,185,952

LEAD CONNECTION FOR PRINTED CIRCUIT BOARD

Filed July 7, 1955 2 Sheets-Sheet 1

INVENTORS.
Glenwood A. Fuller, Robert Ullman, and Rossiter R. Potter.
BY
Austin, Morris & Safford

LEAD CONNECTION FOR PRINTED CIRCUIT BOARD

Filed July 7, 1955 2 Sheets-Sheet 2

INVENTORS.
Glenwood A. Fuller, Robert Ullman, and Rossiter R. Potter.
BY
Curtis, Morris + Safford United States Patent Office 3,185,952
Patented May 25, 1965

3,185,952
LEAD CONNECTION FOR PRINTED CIRCUIT BOARD

Rossiter R. Potter and Robert Ullman, Harrisburg, and Glenwood A. Fuller, Elizabethtown, Pa., assignors to AMP Incorporated, a corporation of New Jersey Filed July 7, 1955, Ser. No. 520,544
19 Claims. (Cl. 339—17)

This invention in general pertains to electrical connections and more particularly in relation to printed electrical circuit boards, the method of connecting electrical components and the like to such boards and the connection thus formed.

In the art of manufacturing electronic assemblies or sub-assemblies by employing printed circuitry, the usual method of mounting electrical components and jumper leads to the circuitry board has been merely to fix the components to the panel by threading the component leads through the circuit board holes and bending or clinching the lead ends so as to fasten the component tightly against the circuit board surface. With the component thus clinched, the board is then dipped in a bath of molten solder whereby to reinforce the mechanical and electrical connection with solder. In connecting the ends of jumper leads to the board, the stripped ends of such leads commonly are threaded through appropriate holes and bent so that during the solder-dipping operation the insulation of the lead provides the necessary support on the top surface of the board.

Certain inherent disadvantages, however, stem from mounting components tightly against the face of the board. Poor circulation of air for those components, such as resistors, which tend to become heated in operation may result in component failure due to overheating. Moreover, for those boards which include printed circuitry on both faces, it is undesirable to have resistive components, being a source of heat, in direct contact with the more or less delicate metallic strips forming the printed circuitry.

In the connection of jumper leads it is especially important to provide a mechanical connection which has a high resistance to pushing, pulling or twisting without relying on the bond between the underlying copper strip and the surface of the dielectric forming the body of the circuitry board. Any stresses placed on the jumper lead, when connected by the conventional method, which may occur during assembly of the boards or through maintenance and testing of the electronic units formed thereby result in a direct strain on the copper bond of the printed circuit. Unless great care is taken, these stresses will result in stripping the copper from the face of the board.

Accordingly, it is an object of the present invention to provide an improved means and method for mounting electrical components to printed circuit boards.

Another object is to provide a means for mounting in spatial disposition components on printed circuit boards with a mechanical connection between the lead wires of the component and the board that lends stability to the connection both prior and subsequent to any solder-dipping operation.

A further object is to provide a method for adapting component leads of a range of diameters to a uniform size, permitting standardization of the circuit board holes.

Still another object is to provide an adapter for electrical components which produces a uniform and reliable mechanical connection with a given size circuitry board hole throughout a relatively wide range of hole diameters as permitted by design tolerances.

A still further object is to provide an adapter for component leads especially designed to enhance the flow of solder, through capillary action, up through the hole and around the component lead during the solder-dipping stage of circuitry board assembly.

Yet another object is to provide an adapter for electrical component leads which, upon insertion into a circuit board hole, leaves a predetermined maximum void space without reducing the mechanical stability of the connection.

Still another object is to provide an adapter for component leads which facilitates the insertion of the leads within circuit board holes by automatic fitting machines in a mechanized assembly line.

These objects are, in general, attained by imparting a cuneate configuration of special design to the end portions of the component leads. Conveniently, such configuration may be obtained by cold-forging or crimping about the component lead ends a pre-formed sheet metal adapter which is, according to one embodiment of the present invention, generally U-shaped in cross-section and includes a trough from opposed side edges of which respectively extend a pair of upstanding ears adapted to be forced during crimping into tight engagement with at least a portion of the component lead. The adapter may be applied, for example, by crimping or shaping dies having die faces which converge toward the end of the lead so that for leads of varying diameter more or less of the metal composing the adapter and lead is extruded away from the lead end, thus forming the end portion of the lead to precisely a uniform cross-section, independent of the original diameter of the lead, and tapering to a point substantially coaxial with the axis of the component lead. The free ends of the upstanding ears of the connector may be curled or deformed, if desired, about a tight radius leaving a space between the opposed inwardly curled ear faces between which an indentor may pass to form a groove in a wire. Upon insertion of the formed lead end in a circuit board hole, the wire groove, supplemented in part by the curled ears of the adapter and in part by the side walls of the hole, forms a capillary tube through which solder readily flows. In its final form the lead end portion is substantially rectangular in cross-section with the bottom side edges being relatively sharp so as to make firm contact with the side walls of the circuit board hole in accordance with the taper whereby to achieve a good mechanical connection.

Other objects and attainments of the present invention will become apparent to those skilled in the art upon a reading of the following detailed description when taken in conjunction with the drawings in which there are shown and described several embodiments; it is to be understood, however, that these embodiments are not intended to be exhaustive nor limiting of the invention but are given for purposes of illustration in order that others skilled in the art may fully understand the invention and the principles thereof and the manner of applying it in practical use so that they may modify it in various forms, each as may be best suited to the conditions of a particular use.

Figure 1:
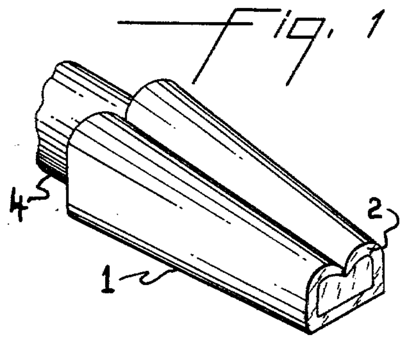
FIGURE 1 is a perspective view of the end portion of an electrical component lead formed in accordance with one embodiment of the present invention.

Generally in the solder-dip method of effecting the electrical connections between the leads of an electrical component and the conductive strips of a printed circuit panel, after application of an appropriate fluxing agent, the component is mechanically set in the panel by threading the leads through the holes from which the conductive strips desired to be connected through the component radiate. As thus connected, the underside of the panel is dipped in a bath of molten solder whereupon solder wicks between the lead and the side walls of the hole to provide the desired solder joint. Such operations are well known in the art of processing printed circuit panels and they may be carried out manually, or desirably accomplished completely automatically, e.g., by a plurality of machines operating serially which assemble a complete electronic subassembly from a supply of circuit panels, leads and electrical components. Such machines typically comprise means for initial preparation of the panels and placing them on a conveyor along which is aligned a battery of machines for preparing and fitting to the panels each of the various electrical components comprising the electronic subassembly, the last stage in the assembly line being a solder-dipping operation.

In the following description reference will be made to the adaptation of our invention to use with printed circuit boards or panels such as are employed in the art of automatically pre-formed electrical circuitry, but it is to be understood that this application is selected by way of example and other applications will be apparent to those skilled in the art. Moreover, the reference to printed circuit boards specifically is not to be taken as limiting since the invention is equally applicable to the panels formed of any suitable dielectric material, and any method of reproducing a circuit design on either the upper or lower surfaces, or both, may be employed, such as by painting, spraying, chemical deposition, die stamping, laminating, etc.

It is desirable, especially where conductive strips are printed on both surfaces of the panel, that the leads of the electrical components be set in the holes of the printed circuit board in a manner to support mechanically the body of the component away from the surface of the board both during and subsequent to the solder-dipping stage in assembly. To provide such support, the end portion 1, FIGURE 1, of each of the component leads is shaped to have generally a cuneate configuration tapering toward the tip 2 from a maximum transverse dimension at least equal to the diameter of the circuitry board hole whereby the lead end portion may be mechanically locked in the hole by a wedging action. As will be described in connection with FIGURE 4, leads 4, typically single stranded solid wires, when bent into a U-shape and anchored at tips 2 are contemplated to have sufficient rigidity to support the component body 3 off the face of board 5.

Figure 16:
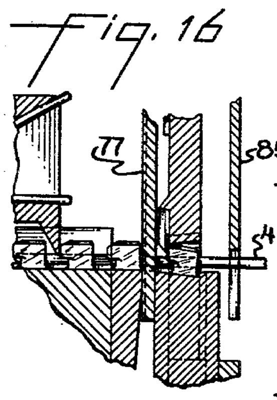
FIGURE 16 is a fragmentary sectional view of dies in an intermediate stage of operation for crimping the adapter of FIGURE 15.
Figure 8:
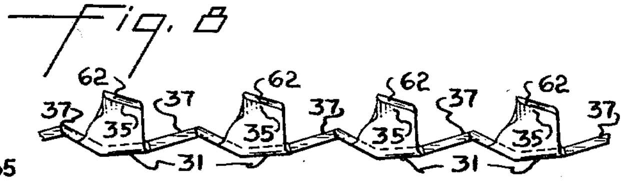
FIGURE 8 is an elevational view of pre-formed adapter blanks in strip form which may be utilized to produce the lead end portion of FIGURE 5.

The cuneate form may conveniently be imparted to the lead ends by cold-forging thereon an adapter member 7 of a suitable malleable sheet metal stock, the cold-forging operation being performed through the use of die apparatus generally similar to conventional and well-known crimping apparatus for applying solderless electrical terminals and exemplified by Patent No. 2,692,422 issued October 26, 1954, to Frank L. Pierce, except that, as will be described in connection with FIGURES 11, 12 and 16, a longitudinal convergence is imparted to both the operating faces of the die parts. Adapter members 7, as preformed blanks in FIGURE 2, each may comprise a trough 9 having a pair of upstanding ears 11 extending from opposed side edges, with a connecting link 12 joining a pair or more of troughs in end-to-end strip fashion if desired.

Figure 2:
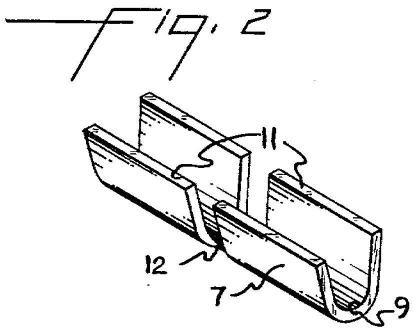
FIGURE 2 is a perspective view of a plurality of adapter members in strip form prior to their application to component leads to produce the lead end portion shown in FIGURE 1.

Forming of adapter members 7 to the configuration shown in FIGURE 2 is accomplished by blanking and forming techniques generally well-known in the art, and preferably from strip stock whereby a large number of elements may be joined as a continuous strip rolled into a reel, thus to facilitate handling and subsequent application to component leads by automatic or semi-automatic crimping machines as will be referred to in connection with FIGURES 8 to 13. Prior to application of the adapters, the base metal composing the adapter strip is preferably plated with a metal, such as tin, to which solder readily adheres. In contemplation of the soldering operation each adapter, conveniently while still in strip form, may have applied thereto a non-corrosive flux, for example, stearic wax, which preferably also has characteristics rendering the flux capable of acting as a lubricating agent for the crimping dies during the crimping operation. In the crimping operation lead 4 is disposed within trough 9 and ears 11 are curled under compression about and inwardly toward the lead to effect an intimate contact securely affixing adapter 7 to the lead. Preferably the crimping die parts include a flat or slightly concave anvil whereby the resultant crimp will be substantially rectangular in cross-section, FIGURE 3, having relatively sharp corners 13 along the bottom side edges with the upper surfaces of ears 11 shaped to define a longitudinal groove 15 along the top.

In addition to providing for a wedging action, tapering the crimp of adapter 7 facilitates insertion of lead end portion 1 within the circuitry board holes. This is especially advantageous where the components are to be inserted by automatic means since the accuracy required of such means may be reduced proportionally with the sharpness of tip 2. Moreover, by maintaining the crimp height, being defined by the degree to which the die parts of the crimping apparatus are closed, the wide range of wire sizes encountered in mounting the variety of electrical components utilized in printed circuit applications are advantageously reduced to a uniform size and shape at end portion 1 whereby standardization and uniformity of the circuit board holes may be achieved regardless of the diameter or character of the component lead. To this end the taper angle and crimp height are set so that the smallest diameter wire employed will just be sufficiently gripped to furnish adequate support for the component, and the maximum transverse dimension at the rearward end of adapter 7 is greater than the hole diameter with the length of adapter 7 being not significantly greater than the thickness of the circuitry board. For example, on a standardized 0.072 inch hole diameter, an included taper angle of 10° for a crimp 0.170 inch in length for boards in the range of 0.060 inch thickness will accommodate wire sizes from 0.020 to 0.047 inch in diameter. It will be understood, of course, that with a constant crimp height the smallest accepted wire will be engaged by ears 11 during crimping only over a limited length from tip 2 along the length of adapter 7, but as larger wire sizes are used, the effective crimp length will increase until substantially a voidless crimp is had over the whole length of the crimped area. Larger wire sizes than that in which the mass of metal included within the crimp length precisely matches the void space within adapter 7 may be used since any excess of wire metal will simply be extruded out of the crimp area back along the wire axis due to crimping on a taper.

Referring again to FIGURE 3, wedging end portion 1 within hole 17 of circuitry board 19 causes corners 13 to bite into the sidewalls of the hole thus securely anchoring lead 4 in a manner such that stresses on the lead or component will be absorbed in the mechanical lock afforded by adapter 7 without transmission to or reliance on the strength of the bond between conductive strips 21 and board 19 prior or subsequent to soldering.

In the solder-dipping operation, to promote the wicking of solder through capillary action and formation of solder fillets on both the upper and lower surfaces of board 19 around end portion 1, whereby conductively to couple lead 4 with conductive strips 21, the configuration of end portion 1 in cross-section relative to hole 17 should provide as much void area as possible without adversely affecting the holding power of adapter 7 for the component lead. In the embodiment shown in FIGURES 1 to 3, the primary paths for the flow of solder are up along adapter 7 between its bottom surface and the side walls of hole 17, and along the top surface of adapter 7 and that portion of the side walls of hole 17 bounded by the tangential points of contact with curled ears 11, the closed boundaries of these paths defining capillary tubes having cross-sectional end areas indicated respectively at A and B in FIGURE 3.

Figure 4:
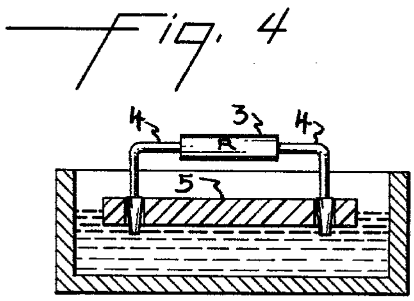
FIGURE 4 is a diagrammatic side view of an electrical component mounted on a printed circuit board during dipping of the board in a molten solder bath.

Upon applying molten solder to the underside of the circuitry board, as by dipping the assembly in a solder bath, FIGURE 4, solder will rise in capillary tubes A and B and on reaching the fluxed printed strip 21 ringing hole 17 will spread to form after hardening into a solder fillet. Solder will also cling to and harden on the metal surfaces on the underside of board 19 thus to form a fillet, or solder button surrounding end portion 1 on both sides of board 19 as is shown and more particularly described in connection with FIGURES 6 and 7.

Figure 3:
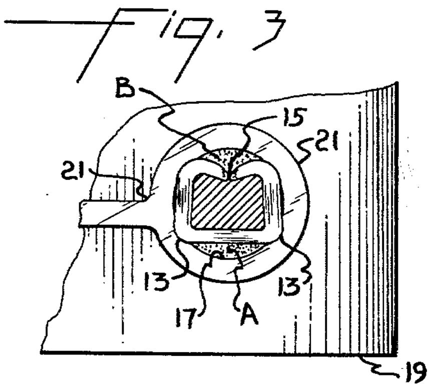
FIGURE 3 is a fragmentary sectional plan view illustrating the mounting of the lead end portion of FIGURE 1 in a hole of a printed circuit board.

The method employed to crimp adapter 7 to the component lead is especially advantageous in that groove 15, formed by inwardly curled ears 11, increases the size of capillary tube B, thus enhancing the flow of solder in the solder-dip operation and ultimately the reliability of the electrical connection, by virtue of the solder, between lead 4 and strip 21. In the embodiment of FIGURES 1 to 3, however, the electrical qualities of the connection between lead 4 and strip 21 depend in large measure upon the effectiveness of the connection between lead 4 and adapter 7 since at best a relatively small surface area of the lead will be in direct contact with the solder.

Figure 7:
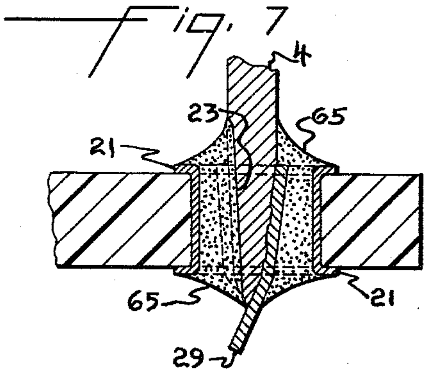
FIGURE 7 is a view generally taken along lines 7—7 of FIGURE 6 and illustrating the formation of solder fillet in connection with the lead end portion shown in FIGURE 5.

Preferably, end portion 1 is formed so that solder comes in contact over a substantial area with freshly exposed surfaces of lead 4 thereby directly coupling strip 21 and lead 4. To this end, and to enhance the solder flow of characteristics of capillary tube B, in the embodiment described in connection with FIGURES 5 to 10, a longitudinal passageway or groove 23 is provided along the upper surface of the lead end portion 27, FIGURE 10, which exposes lead 4 regardless of any adapter member which may be formed on the lead end portion. Advantageously, the upstanding ears of an adapter member form the passageway side walls and the component lead provides the bottom boundary, the lead preferably being impacted in the trough of the adapter member together with a coining action which exposes fresh metal in the bottom of the groove. As shown, groove 23 extends substantially along the formed end of the lead which is coined or indented to a depth equal to approximately the center thereof at tip 29, the groove depth tapering away from the lead axis in accordance with the taper of end portion 27 as best shown in FIGURE 7 and varying in depth of indentation according to the lead diameter of the component involved.

Figures 9, 15:
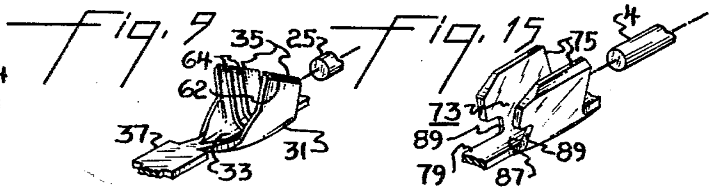
FIGURE 9 is a perspective view of a pre-formed blank shown in FIGURE 8.
FIGURE 15 is a perspective view of an adapter member which may be utilized to produce the lead end portion of FIGURE 14.

End portion 27, similar to end portion 1 of FIGURES 1 to 3, may conveniently be formed through utilization of an adapter member 31, FIGURE 9, which, in general, comprises a trough 33 for receiving lead 4 and upstanding ears 35 extending from the side edges of trough 33, ears 35 being adapted to be curled inwardly toward the lead in a manner to be described. Although the adapters may be separate pieces formed about the ends of the component leads by hand tools with the components thereafter being supplied to feeding machines in the circuit board assembly line, it is contemplated that the adapters will be made in strip form, that is, connected in end-to-end fashion as by links 37, FIGURE 8. As thus connected, the adapters may be automatically fed and applied by standard applicator machines which may be made a part of the circuit board assembly line, such machines, except for the crimping section thereof, forming no part of the present invention and hence being omitted for purposes of simplicity.

Figure 11:
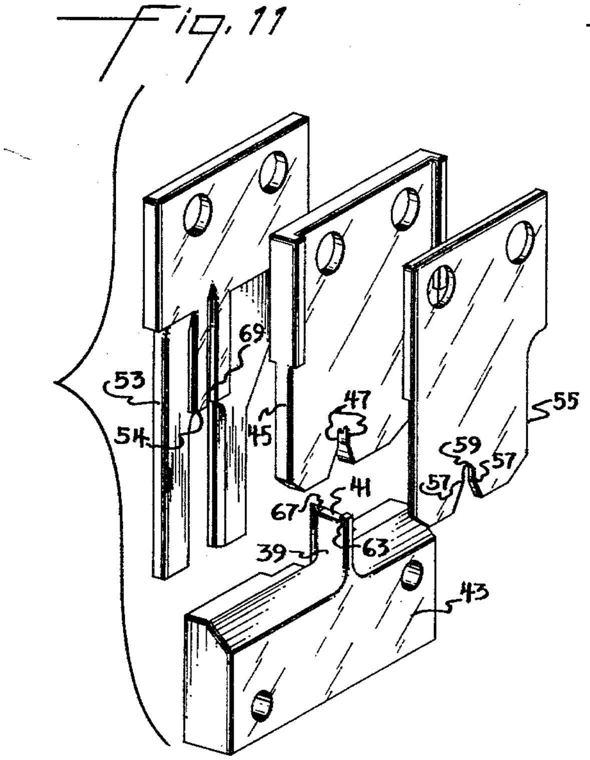
FIGURE 11 is an exploded perspective view of the dies for crimping the embodiment of the adapter member shown in FIGURES 8 and 9.

The crimping die section, shown in exploded view in FIGURE 11, includes an upstanding generally rectangular column or post 39 which comprises the die anvil, the anvil being provided with a substantially flat die face 41 of a length slightly greater than trough 33. Post 39 projects from lower die block 43 which is rigidly mounted on the fixed press bed, not shown, of the applicator machine. Upper die block 45 is provided with a recess formed by side walls 47 which are spaced to receive column 39 when the dies are being closed, FIGURE 13. The end of the recess approximates a W configuration with smoothly rounded bottoms formed by a pair of parallel cylindrical troughs 49 each of which is tangential to one of side walls 47 and which unite to form a longitudinal ridge 51 along the center line of the recess. Upper die block 45 is mounted on and reciprocates with the movable ram, not fully shown, of the applicator machine. Also mounted on the applicator ram adjacent the rear sides of upper block 45 is a slug-out plate 53 having edges 54 which sever from the strip the leading adapter upon its being disposed in the crimping area on die face 41.

On the front side of upper block 45 is mounted a guide plate 55 having a recess centered relative to the crimping recess and defined by side walls 57 and bottom 59. Side walls 57 initially converge inwardly toward bottom 59 and serve to force leads 4 into alignment with the axis of trough 39 as the die parts move together. Bottom 59 of the guide recess is disposed slightly in advance of the crimping recess relative to the descent of the ram and serves to force the component lead into adapter trough 33 just prior to crimping, this action being especially advantageous where the lead diameter is near the upper end of the range of wire sizes accommodated. As the larger wire sizes contemplated to be crimped have a greater diameter than the diameter of adapter trough 33, the forceful insertion of the leads by guide plate 55 effects a proper crimping action by assuring that the lead enters trough 33 before the inward curling of ears 35.

Figure 12:
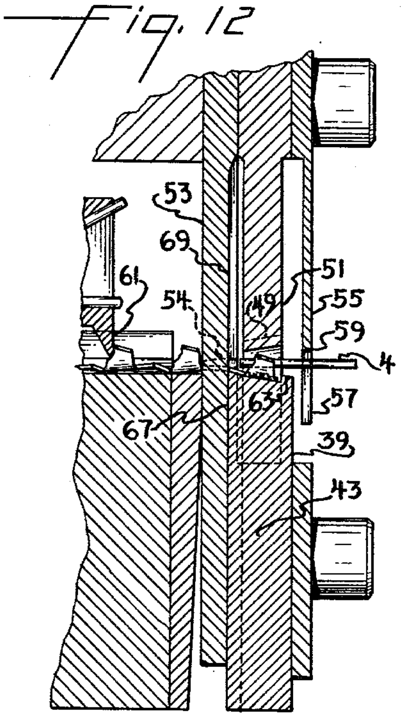
FIGURE 12 is a sectional side view of the crimping dies of FIGURE 11 assembled and in an intermediate stage in crimping an adapter member about a component lead.
Figures 10, 13:
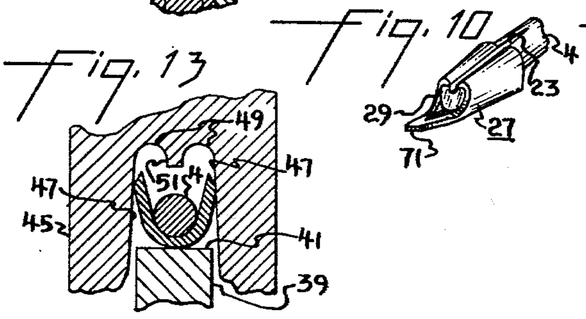
FIGURE 10 is a perspective view of the adapter member shown in FIGURE 9 applied to the end portion of an electrical component lead.
FIGURE 13 is fragmentary front view showing in cross-section the crimping die parts of FIGURES 11 and 12.

In the crimping action, FIGURES 12 and 13, a feed finger 61, operating in timed sequence with the movement of the applicator ram, advances the strip to position the leading adapter on die face 41 prior to the descent of die block 45. As the ram and die block 45 approach lower block 43, guide plate 55 positions lead 4 in trough 33 as the slug-out blade severs link 37 from between the leading pair of adapters. Further descent of die block 45 initiates the curling of ears 35 around the contour of die troughs 49, ridge 51 turning the ends of ears 35 inwardly. As die block 45 continues its downward movement, ridge 51 maintains a separation between the ends of ears 35 which are turned slightly downwardly into lead 4. Ridge 51 effectively passes between ears 35 while curling the ear ends and, in the final portion of the downward stroke of die block 45, indents and coins lead 4 to form groove 23 and substantially a voidless crimp extending along the length of end portion 27 to a degree depending on the diameter of lead 4. To facilitate this curling action the outside ends of ears 35 are preferably beveled or swaged, as at 62, in the blanking process for fashioning the preformed strip.

Figure 6:
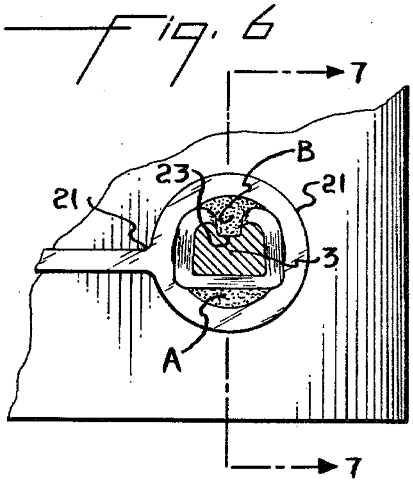
FIGURE 6 is an enlarged view generally taken at lines 6—6 of FIGURE 5, but subsequent to soldering the connection.
Figure 5:
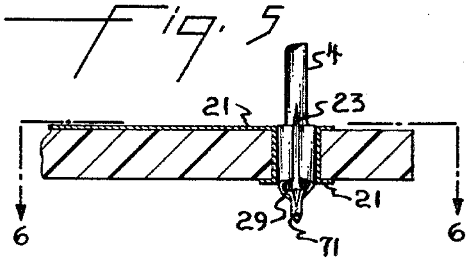
FIGURE 5 is a fragmentary view in elevation of a printed circuit board illustrating the mounting in a circuit board hole of a lead end portion according to another embodiment of the invention prior to soldering the connection.

The crimp, shown in cross-section in FIGURE 6, thus made results in an enlargement of capillary tube B which, on mounting the formed lead end in a circuit board hole, comprises a portion of the side walls of hole 17, the ends of ears 35 and groove 23. The precise shape of tube B and groove 23 depend, of course, on the configuration of the recess in upper forming die 45. Advantageously, troughs 49 curl ears 35 about radii of curvature approximately equal respectively to one-fifth of the width of formed end portion 27, ridge 51 thus also being laterally equal to one-fifth of the aforesaid width and depending from the bottom of troughs 49 to a length slightly greater than the aforesaid width so as to indent substantially to the axis of lead 4 at the forward end of the crimping dies. By way of example, specific dimensions for the dies and adapter member so as to accommodate a wire range of 0.020 to 0.047 inch may be: for the dies, anvil or crimping width—0.067 inch, anvil or crimping length—0.150 inch, radius of curvature of troughs 49—0.013 inch, width of ridge 51—0.012 inch, height of ridge 51—0.017 inch, included angle of die convergence —10°; for adapter 31, thickness of stock—0.014 inch, radius of curvature of trough 33—0.016 inch, with ears 35 extending 0.115 inch above the base of trough 33 and an outside divergence of 0.100 inch at their ends. Similar dimensions for the embodiment shown in FIGURES 1 to 3 may be used except that troughs 49 would have a radius of curvature approximately equal to 27% the width of the crimp and converge to form a sharp cusp instead of the ridge as above defined.

From the foregoing dimensions, it will be apparent that on crimping adapter 31 about component leads having a diameter near the maximum size, a more violent extrusion of metal, both of lead 4 and adapter 31, will occur away from the point of convergence of the tapering die surfaces. To limit the extrusion of the metal of adapter 31 and to prevent the adapter from being forced wholly out of the crimp area, anvil 39 is provided with a lip 63 rising above the anvil surface thus forming a stop shoulder beyond which extrusion of adapter 31 may not occur. In addition, it is desirable, especially where small size leads are involved, that the inside surface of the adapter member be provided with transverse serrations 64 which improve the gripping action near the forward end of the adapter thus to prevent the lead from being squeezed out of trough 33 during crimping. It is also desirable that the rear end edges of adapter 31 be crimped square, that is, after forming, the rear edges should be perpendicular to the axis of lead 4 whereby to provide flat surfaces surrounding the lead of a width equal to the stock thickness on which an insertion tool or machine may conveniently operate to force the lead end into a circuit board hole. For this purpose the top edges of ears 35 are inclined downwardly toward the rear end of trough 33, FIGURE 8, to avoid the tilting of adapter 31 in the crimping dies which would tend to occur should upper die 45 first engage the adapter at the rear end of ears 35. Exemplifying, for a 10° convergence of the dies, a 17° inclination of ears 35 will suffice to assure a square crimp.

With adapter 31 thus formed about the end of lead 4, capillary tube in area and shape is adequate to insure the flow of solder in the solder-dipping operation. In this connection it will be understood that in designing a capillary tube, area is not the sole consideration. A long narrow slot, e.g., the openings bounded by the sides of adapter 31 and the hole side walls, FIGURE 6, has proven in practice to be unreliable in flow characteristics, the narrower the tube opening the less likelihood of achieving consistently good solder connections even though the area of the tube when translated into a circle would be sufficient under the conditions of use. On inserting end portion 27 in a hole with the rear of the adapter substantially flush with the board surface, groove or passageway 23, as shown in FIGURES 6 and 7 and formed with parts having the dimensions given above, provides a capillary tube having an end opening which roughly encompasses a rectangle at least 0.012 inch in width and 0.025 inch in height. Such dimensions have proven reliable under the exemplified conditions of use, a minimum workable width being approximately 0.010 inch at the groove bottom in contact with the lead and a height of about 0.024 inch. The minimum height and width relationship will be affected, however, by the conditions of use, that is, the solder composition as related to its flowability, the wetting characteristics of the solder flux, the degree of taper of the capillary tube, etc. For example, it has been found that the diameter of the larger opening at the bottom of the capillary tube which is essentially cone-like in shape inversely affects, due either to the physics of capillary flow or to greater entrapment of flux from the solder bath, the minimum diameter of the small opening at the other end of the tube.

Hardening of the solder after the solder-dipping operation results in the formation of solder fillets 65, FIGURE 7, on both the upper and lower surface of the circuit board, directly connecting lead 4 at groove 23 with conductive strips 21. In this connection when the diameter of lead 4 is near the low end of the range of wire sizes, the crimping dies at the constant crimp height are effective to coin the lead only over a short length near the lead end. In this event the opening between ears 35 afforded by ridge 51 renders the interior of adapter 31, at approximately the point where the crimp ceases to be voidless, accessible to solder which may then flow along the lead within the adapter thus assuring continuous metal-to-metal contact over the length of lead 4 in the circuit board hole.

Upon forming of lead end portion 27, the components are contemplated to be fed automatically to the mounting machines in the assembly line, such machines effecting an automatic placement of the components in the appropriate holes in the circuit boards. To allow for such machines a maximum tolerance in the accuracy of the placement operation, the tip 29 of the formed lead should be as sharp as possible and coaxial with the lead. For this purpose anvil 39 is provided with an inverted V-shaped extension 67 which cooperates with a V-shaped groove 69 in slug-out blade 53 to shear link 37 from the body of adapter 31 so as to leave a V-shaped extension 71 integral with the frnt end of trough 33, FIGURE 10. To arrange the apex or point of extension 71 in alignment with the axis of lead 4, the plane of extension 67 of anvil 39 is inclined slightly upward relative to the plane of die face 41. To facilitate placement of the adapter body on anvil 41, that portion of link 37 in the pre-formed strip, FIGURE 8, which is to form extension 71 is pre-bent relative to trough 33 in accordance with the inclination of anvil extension 67. For a dimensional example, in combination with the dimensions above referred to, a 12° inclination for anvil extension 67 relative to the place of die face 41 will align the point of a trough extension 71 having a length of 0.068 inch coaxial with lead 4 and cut at an included angle of 50°. Preferably the lower portions of the front edges of ears 35 are provided with transition sections 72 which have a configuration to impart, on crimping the adapter, a tapering U-shaped cross-section to the trough extension in the region adjacent trough 33 whereby to avoid abrupt changes in the cross-section of end portion 27 that otherwise might tend to interfere with the insertion operation.

Figure 14:
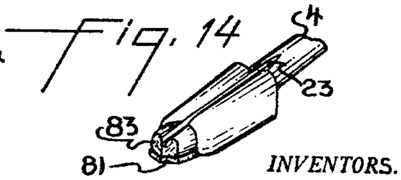
FIGURE 14 is a perspective view of a lead end portion in accordance with another embodiment of the present invention.

In the embodiment shown in FIGURES 5 through 10 the component lead must be placed with some accuracy within trough 33 of adapter 31 to effect optimum crimping, that is, the end of the component lead should be disposed near the foreward edges of ears 35 in order to assure crimping of smaller diameter wires yet must not be inserted so far as to interfere with the formation of the pointed trough extension 71. In automatic application of the adapters this additionally requires accurate pre-trimming of the leads. Advantageously, the leads are trimmed simultaneously with the crimping operation and the accuracy of the lead insertion rendered less critical. To these ends in the embodiment shown in FIGURES 14 to 16, the adapter member 73 is formed to permit insertion of lead 4 past the forward edges of ears 75 whereby in the shearing operation slug-out blade 77 severs strip connecting link 79 in a manner to form sharpened trough extension 81 and simultaneously trims lead 4 to have a pointed end 83 as best shown in FIGURE 14. In this connection the downward pressure exerted by slug-out blade 77 on the lead end during trimming is also advantageous in that in combination with guide plate 85, similar in function to guide plate 55 in FIGURE 11, lead 4 is positively forced into trough 87 from both ends of the adapter prior to curling ear 75 during crimping regardless of the lead diameter. It will be apparent that the most extreme extrusion and coining of metal occurs at the forward end of the crimping dies. Inserting lead 4 to the extent required for trimming during crimping, however, adds to the metal which must be moved out of the critical forward portion of the dies. To reduce the mass of metal at this point the forward edges of ears 73 are notched as at 89 adjacent trough 87.

With the end portions of component leads formed in accordance with the present invention it will be apparent to those skilled in the art that the placement of the leads within the circuit board holes is facilitated and the flow of solder in the solder-dipping operation is enhanced resulting in a high quality mechanical and electrical connection to the board and to the printed conductive strips, with the components being advantageously rigidly and spatially disposed above the surface of the circuit board. It will be further apparent that the provision of the longitudinal groove in the formed lead end will promote the flow of solder by capillary action up through the circuit board holes along the component lead thence to contact the printed conductive strips of the surface of the circuit board, FIGURE 7, regardless of whether the conductive strips are extended to cover the side walls of the circuit board holes.

Obviously the formed end may also provide the means by which printed circuit jumpers may be mounted in the circuit board holes. Commonly, such jumpers are insulated with polyvinyl formal thermo-plastics, such as Formvar, which heretofore had to be initially stripped before electrical contact could be made with the printed strips of the board. According to the present invention, however, Formvar leads can be utilized without prior preparation since in the soldering operation the solder will contact the wire core of the lead either at the trimmed tip, FIGURES 7, 10 and 14, or along the formed groove which, because of the violent deformation of the lead in the crimping operation, provides an area in which the Formvar insulation has been broken.

In addition, it will also be apparent that for lead end portions formed in accordance with the principles of the invention shown and described in connection with FIGURES 5 through 16, the adapter band may be made of a low or non-conductive material since the metal of lead 4 through groove 23 is rendered accessible to solder regardless of the conductivity of the adapter member. Accordingly, the adapter member may be formed of sheet steel, or, if desired, may be of insulating material, such as nylon, pressed as a finished piece or die cast in place. Furthermore, if a sufficient mass of metal is present within the crimping region without the additional metal afforded by the adapter member, the end of the conductor alone can be cold-formed by the dies to the desired configuration.

We claim:

1. In a lead adapted for insertion into a hole of a printed circuitry board to connect an electrical component to the printed strips radiating from the hole, an adapter member disposed about and in compressed engagement with the end of the lead for conforming the lead to uniform outside dimensions matable with a board hole of standard size, said adapter member including a bottom portion and a pair of side walls respectively extending upwardly from opposed sides of said bottom portion for receiving said lead end and defining therewith a lead end portion, at least portions of said sidewalls at the insertion end of the member being pressed against and gripping said lead, the ends of said sidewalls being spatially disposed to provide a longitudinal slot in said member, a groove in said lead end portion in alignment with said slot to provide for the flow of solder upon passing the board through a solder-dipping operation, at least two opposed surfaces of said lead end portion having a relative convergence to reduce the maximum lateral dimension of the tip thereof to substantially less than the diameter of the hole, the maximum lateral dimension of said lead end portion being at least as great as the diameter of the hole.

2. A crimped terminal connection comprising a generally U-shaped member formed from an integral piece of thin sheet metal and having ears upstanding from the sides thereof defining a longitudinal channel, a bared wire projecting into said channel through one end thereof, said ears being crimped on the wire throughout the length of the wire within said channel with parts of said ears folded over the wire and formed so as to leave a part of the wire throughout its length in the crimped terminal exposed along one side thereof, said connection being characterized in that the terminal and the end of the wire are crimped together under metal-deforming pressure so as to cold flow the terminal and the end of the wire and integrate the same into a unitary mass, the outer periphery of the crimped portion of said terminal being formed to provide an electric current conducting contact surface, said terminal tapering throughout its length from a greater to a lesser cross section from said one end toward the front thereof.

3. A composite lead construction for insertion into a hole of a printed circuitry board to connect an electrical component to the printed strips radiating from the hole comprising a lead wire, an adapter member integrated with the end of the lead wire to define a lead end portion, metal of the lead wire extending substantially the length of the lead end portion, the forward part of said end portion having a maximum transverse dimension less than the hole diameter for providing a lead-in tip adapted to guide said end portion into the hole, lateral dimensions of said end portion progressively increasing toward the rearward part thereof to at least equal to the diameter of the hole, said lead end portion being non-circular in cross-section to form passages of capillary dimensions between the hole side walls and the lead end portion longitudinally extending along the end portion for at least the thickness of the board on insertion thereof in the hole for the capillary flow of solder.

4. In a lead adapted for insertion into a hole of a printed circuitry board to connect an electrical component to the printed strips radiating from the hole, an adapter member disposed about and in compressed engagement with the end of the lead for conforming the lead to uniform outside dimensions mateable with a board hole of standard size, said adapter member including a bottom portion and a pair of side walls respectively extending upwardly from opposed sides of said bottom portion receiving said lead end and defining therewith a lead end portion, at least portions of said sidewalls at the insertion end of the member being pressed against and gripping said lead, the ends of said sidewalls being spatially disposed to provide a longitudinal slot in said member exposing said lead and to form therewith a groove to provide for the flow of solder upon passing the board through a soldering operation, at least two opposed surfaces of said lead end portion having a relative convergence to reduce the maximum lateral dimension of the tip thereof to substantially less than the diameter of the hole, the maximum lateral dimension of said lead end portion being at least as great as the diameter of the hole.

5. An electrical connection comprising a generally U-shaped terminal member formed from an integral piece of thin sheet metal and having a base and ears upstanding from the sides thereof defining a longitudinal channel, a bared wire projecting into said channel through one end thereof, said ears being tapered downwardly lengthwise of said channel, channel extension means at the forward end of the terminal member forming a tip which tapers toward a point, the ears gripping the wire at least along a length of the wire at said other end of said channel with the outer ends of said ears spaced from each other, said connection tapering from a greater to a lesser cross-section from said one end toward the tip end thereof.

6. An electrical connection comprising a generally U-shaped terminal member adapted to be formed in strip form from an integral piece of thin sheet metal and having a base and ears upstanding from the sides thereof defining a longitudinal channel open along the side opposite the base, a bared wire projecting into said channel through one end, said ears being tapered downwardly lengthwise of said channel, channel extension means at the forward end of the terminal member forming a tip which tapers toward a point, transverse grooves in the channel forming internal shoulders embedded in the wire so as to resist axial separation of the wire from the terminal, the ears gripping the wire at least along a length of the wire at said other end of said channel with the outer ends of said ears terminating in spaced relation so as to define a longitudinally extending solder flow groove between the outer ends of said ears and to leave exposed part of said wire.

7. A complete lead construction for insertion into a hole of a printed circuit board for connecting an electrical component to the printed strips radiating from the hole upon applying solder to the underside of the board, comprising a lead wire, an adapter member integrated with the end of the lead wire to define therewith a lead end portion frictionally engageable with the sidewalls of the hole, a longitudinal open-sided and channel-shaped passageway extending along one side of said end portion to a length at least the thickness of the board, said lead wire extending substantially the length of said lead end portion and forming in part the surface of said passageway, the passageway being of capillary dimensions for inducing the flow of solder therealong from one to the other surface of the board.

8. A lead construction as set forth in claim 7 wherein said passageway is of channel form having a bottom and sidewalls respectively provided at least in part by said lead and said adapter member.

9. A composite lead end construction for insertion into a hole of a printed circuitry board to connect an electrical component to the printed strips radiating from the hole, a U-shaped adapter member, a lead wire, said member being disposed about the end portion of the lead wire for conforming the lead wire to uniform outside dimensions mateable with a board hole of standard size, said adapter member including a bottom portion and a pair of sidewalls receiving therebetween and turned toward one another against the end of the lead wire to define therewith a lead end portion generally rectangular in cross-section, said member adjacent its insertion end gripping the very end of said lead wire, at least two opposed surfaces of said lead end portion converging toward one another to a tip having a maximum lateral dimension substantially less than the hole, said tip providing means for guiding said lead end portion into the hole, the maximum lateral dimension of said lead end portion being at least as great as the diameter of the hole.

10. A composite lead construction for insertion into a hole of a printed circuit board for connecting an electrical component to the printed strips radiating from the hole upon applying solder to the underside of the board, comprising a lead wire, an adapter member integrated with the end of the lead wire to define therewith a lead end portion frictionally engageable with the sidewalls of the hole, the sidewall-engaging part of the lead end portion having greater lateral dimensions than any part forward thereof to the tip of said lead end portion, said lead wire extending substantially the length of said lead end portion, an open-sided passageway of substantially uniform cross-section extending along said end portion to a length at least the thickness of the board, the open side arranged to be closed by the hole sidewalls upon insertion of said end portion into a hole, the passageway being of capillary dimensions for inducing the flow of solder therealong from one to the other surface of the board.

11. A composite lead construction substantially as set forth in claim 10 wherein said passageway on being complemented by the hole side walls provides a capillary tube with an end opening on the upper surface of the board, said end opening being at least 0.024 inch in one transverse dimension and at least 0.010 inch in the dimension perpendicular to said transverse dimension, the end opening on the underside of the board being enlarged to at least 0.024 inch in all transverse dimensions.

12. A lead for insertion into a hole of a printed circuit board to connect an electrical component to the printed strips radiating from the hole, said lead having an end portion of substantially rectangular transverse cross-section, at least one side thereof being inclined toward the opposite side to taper said portion along substantially its entire length toward its tip from a maximum lateral dimension at least equal to the diameter of the hole in which said portion is intended to be inserted to lateral dimensions at said tip less than the hole diameter, a longitudinal groove in one side of said portion extending at least along a length of said portion so as to be coextensive with the wall of the hole after insertion of the portion therein, said groove having a width and depth to draw solder from one side of the printed circuit board to the other upon said portion being wedged in the hole and molten solder applied to the underside of the board.

13. In an electrical assembly including a printed circuitry board having a hole from which a conductive strip on a surface of the board radiates, a lead wire disposed within the hole, a cuneate adapter member having a channel receiving the lead wire and in tight engagement with the lead wire, said member being in frictional engagement at a plurality of spaced points with the side walls of the hole, a longitudinal opening in said member exposing said lead wire, a solder fillet surrounding said member and lead wire on said surface of the board and overlying and contacting the conductive strip, and a solder filament integral with said fillet and disposed in said opening in contact with said lead wire.

14. In an electrical assembly including a printed circuitry board having a hole from which a conductive strip on one surface of the board radiates, a lead wire disposed within the hole, and coated with a tough insulation, the end of said lead wire being severed to expose the metallic core, an adapter member surrounding and in tight engagement with the lead wire, said member being in engagement with the side walls of the hole, a solder fillet surrounding said member in contact with the exposed lead wire core on one surface of the board, a solder fillet surrounding said member and overlying and contacting the conductive strip on said surface of the board, and a solder filament connecting said fillets.

15. In an electrical assembly including a printed circuitry board having a hole from which a conductive strip on the surface of the board radiates, a lead wire disposed within the hole, an adapter member surrounding and in tight engagement with the lead wire, said member being in engagement with the side walls of the hole, a longitudinal opening in said member exposing the metal of said lead wire, a solder fillet surrounding said member and lead wire on said surface of the board and overlying and contacting the conductive strip, and a capillary solder filament in connection with said fillet and disposed in said opening in contact with said lead wire.

16. In an electrical assembly including a printed circuitry board having a hole from which a conductive strip on one surface of the board radiates, a lead wire disposed within the hole, a cuneate adapter member surrounding and in tight engagement with the lead wire to define therewith a lead end portion in frictional engagement at a plurality of spaced points with the side walls of the hole, a longitudinal opening in said member exposing a groove in said lead wire, a solder fillet surrounding said lead end portion on said surface of the board and overlying and contacting the conductive strip, and a capillary solder filament integral with said fillet and disposed in said groove in contact with said lead wire.

17. In an electrical assembly including a printed circuitry board having a hole from which a conductive strip on one surface of the board radiates, a lead wire disposed within the hole, an adapter member surrounding and in tight engagement with the lead wire, said member being in engagement with the side walls of the hole, a longitudinal opening in said member exposing a groove in said lead wire, solder fillets surrounding said member and lead wire on the opposed surfaces of the board respectively, one of said fillets overlying and contacting the conductive strip, and a solder filament connecting said fillets and disposed in said groove in contact with said lead wire.

18. In an electrical assembly including a printed circuit board of inflexible insulating material having a hole from which a conductive strip on the surface of the board radiates, a component lead wire disposed within the hole, an adapter member attached to and gripping said lead wire to form therewith a lead end portion frictionally engaging the side walls of the hole and providing a continuous capillary passageway from one to the opposite side of the board, a capillary solder fillet surrounding said lead end portion on one side of the board and overlying and contacting the conductive strip, and a solder filament integral with said fillet and extending along said passageway to the opposite side of the board and in contact with said lead end portion.

19. An electrical assembly according to claim 18 wherein said filament extends along an external surface of said lead end portion and directly contacts said lead wire.

References Cited by the Examiner

UNITED STATES PATENTS

| | | | |
|---|---|---|---|
| 116,636 | 7/71 | Selden | 29—406 X |
| 342,173 | 5/86 | Bock | 29—193.5 |
| 1,827,337 | 10/31 | Schwartz | 287—20.1 |
| 1,955,695 | 4/34 | Veling | 339—276 |
| 1,982,169 | 11/34 | Kollath | 29—155.5 X |
| 1,995,115 | 3/35 | Douglas | 339—258 |
| 2,041,956 | 5/36 | Reid | 29—193.5 |
| 2,064,184 | 12/36 | Stevens | 174—126 |
| 2,066,511 | 1/37 | Arlt | 174—84 |
| 2,183,109 | 12/39 | Sipe | 339—276 |
| 2,288,918 | 7/42 | Parker | 29—155.55 |
| 2,350,601 | 6/44 | Frank et al. | 174—84 |
| 2,409,966 | 10/46 | Voity et al. | 29—190 |
| 2,483,424 | 10/49 | Martines. | |
| 2,492,236 | 12/49 | Mydlil. | |
| 2,502,291 | 3/50 | Taylor | 29—155.5 |
| 2,550,578 | 4/51 | McBerty. | |
| 2,564,098 | 8/51 | Dorjee | 29—155.55 X |
| 2,588,172 | 3/52 | Snavely | 174—70.2 X |
| 2,596,528 | 5/52 | Carlson | 29—155.55 |
| 2,640,903 | 6/53 | Kohring | 339—221 X |
| 2,650,415 | 9/53 | Kingman | 339—220 |
| 2,659,875 | 11/53 | Yarrow | 339—220 |
| 2,692,422 | 10/54 | Pierce | 339—250 X |
| 2,695,329 | 11/54 | Sabine | 174—126 |
| 2,707,272 | 4/55 | Blitz | 339—17 |
| 2,723,384 | 11/55 | Lang | 339—194 |
| 2,748,452 | 6/56 | Pierce | 29—155.55 |
| 2,756,485 | 7/56 | Abramson et al. | 29—155.5 |
| 2,757,443 | 8/56 | Steigerwalt et al. | 29—155.5 |
| 2,778,097 | 1/57 | Berg | 29—193.5 |
| 2,816,275 | 12/57 | Hammell | 29—155.55 X |
| 2,818,632 | 1/58 | Hammell | 29—155.55 |
| 2,902,629 | 9/59 | Little et al. | 174—68.5 X |
| 3,020,520 | 2/62 | Berg | 339—273 |
| 3,059,152 | 10/62 | Khouri | 339—17 X |

OTHER REFERENCES

Electrical Manufacturing, August 1943, page 143.

Publication I: "Components for Printed Circuits," Mannix et al., published in Radio-Electronic Engineering (pp. 17–19 and 34 relied on), copy available in the Scientific Library and Div. 65.

JOSEPH D. SEERS, *Primary Examiner.*

WHITMORE A. WILTZ, JOSEPH C. MANIAN, *Examiners.*